United States Patent
Shih

(10) Patent No.: US 10,181,401 B1
(45) Date of Patent: Jan. 15, 2019

(54) METHOD FOR MANUFACTURING A SEMICONDUCTOR DEVICE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 15/865,227

(22) Filed: Jan. 8, 2018

(51) Int. Cl.
| | |
|---|---|
| *H01L 21/027* | (2006.01) |
| *H01L 21/8234* | (2006.01) |
| *H01L 21/02* | (2006.01) |
| *H01L 21/311* | (2006.01) |
| *H01L 21/3213* | (2006.01) |

(52) U.S. Cl.
CPC .... *H01L 21/0273* (2013.01); *H01L 21/02164* (2013.01); *H01L 21/31138* (2013.01); *H01L 21/3213* (2013.01); *H01L 21/823468* (2013.01)

(58) Field of Classification Search
None
See application file for complete search history.

(56) References Cited

U.S. PATENT DOCUMENTS

2011/0248382 A1  10/2011  Pellizzer et al.

FOREIGN PATENT DOCUMENTS

CN  102082081 B  9/2015

*Primary Examiner* — Marcos D Pizarro Crespo
*Assistant Examiner* — Lawrence C Tynes, Jr.
(74) *Attorney, Agent, or Firm* — CKC & Partners Co., Ltd.

(57) ABSTRACT

A method for manufacturing a semiconductor device includes: forming a first patterned target layer on a substrate having a first region and a second region, the first patterned target layer having first openings along a first direction in the first region; forming a patterned hard mask layer over the first patterned target layer and having first recesses along a second direction in the first region and second recesses along the first direction in the second region; forming a patterned photoresist layer over the patterned hard mask layer and having stripe structures along the second direction in the first region and block structures along the first direction in the second region; and etching the patterned photoresist layer, patterned hard mask layer, and first patterned target layer to form a second patterned target layer.

11 Claims, 16 Drawing Sheets

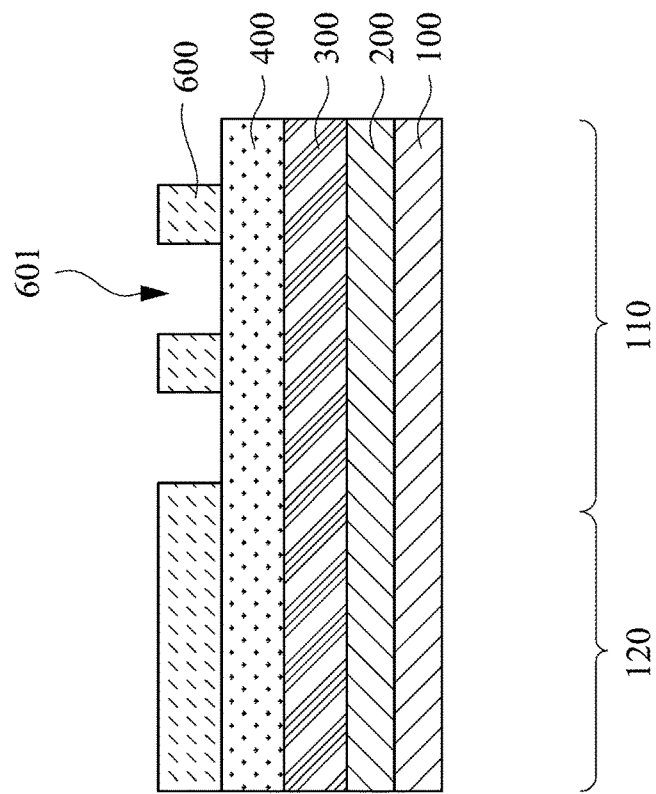
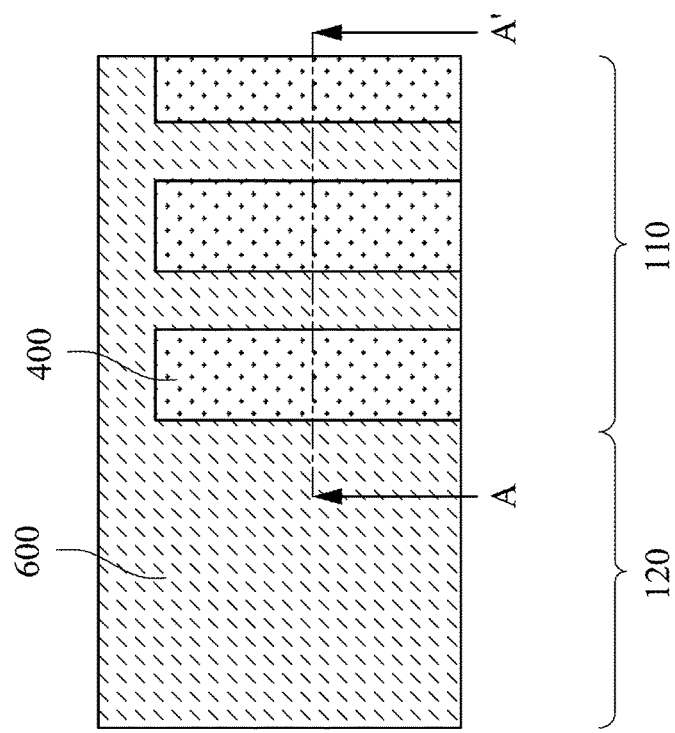

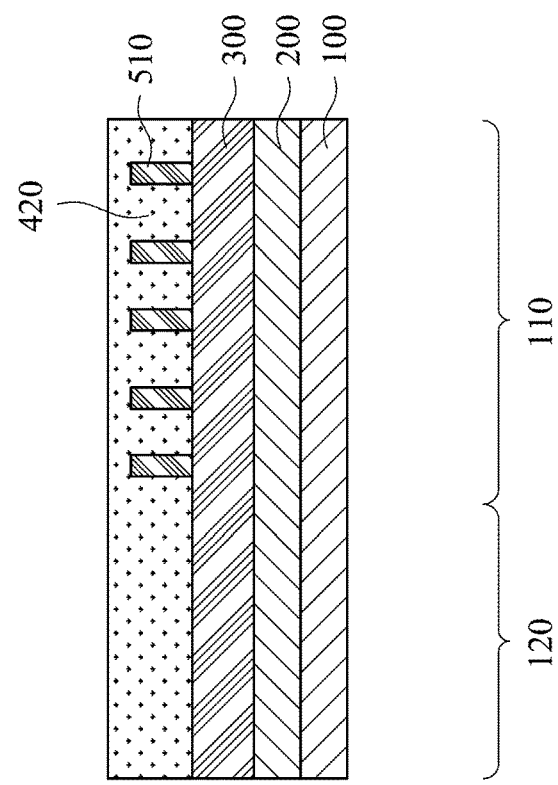
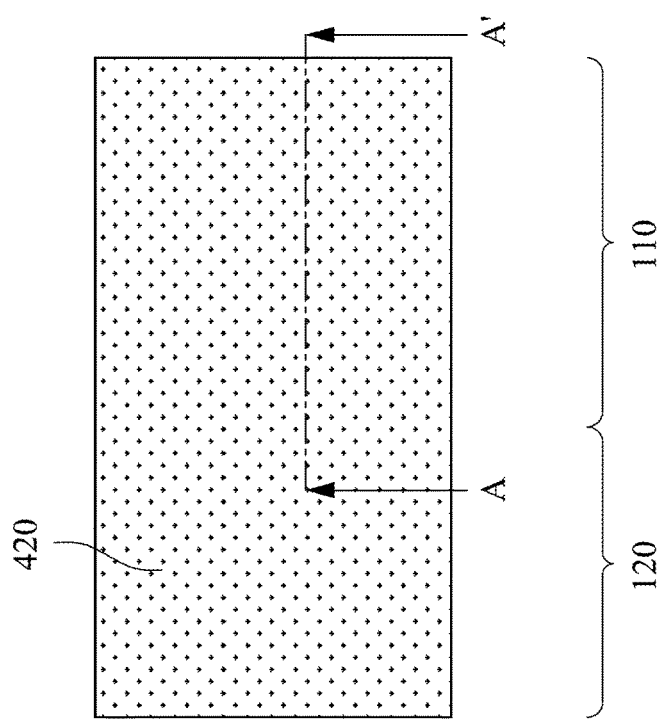
Fig. 5B
Fig. 5A

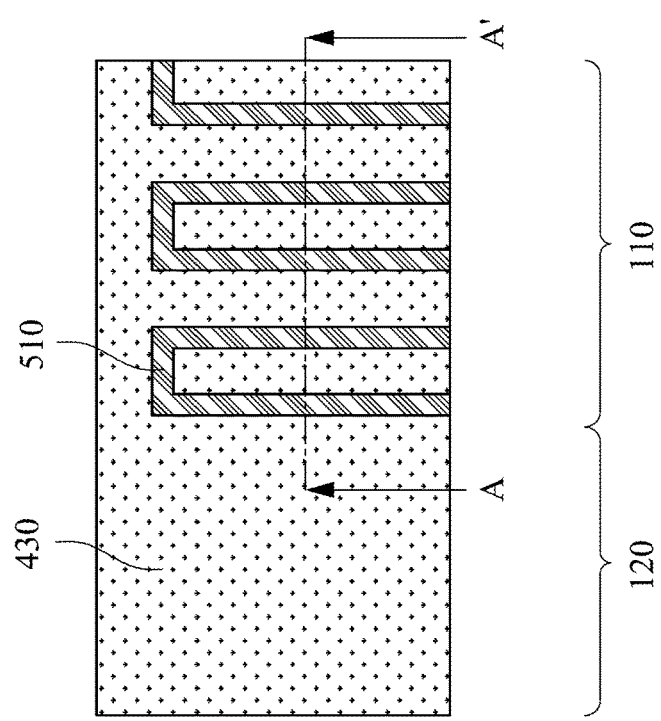
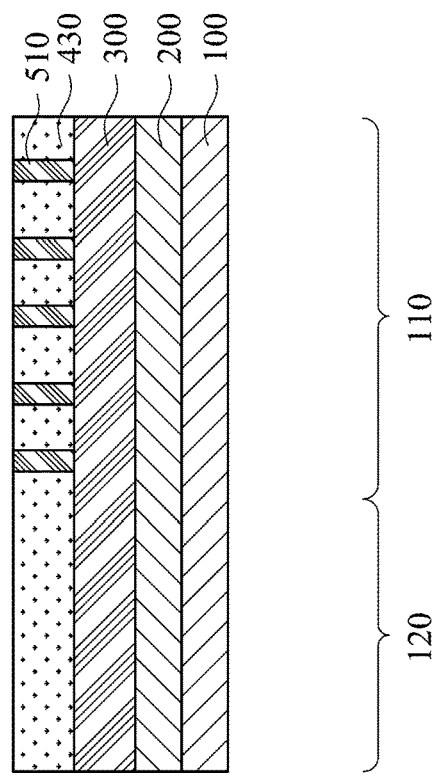
Fig. 6A
Fig. 6B

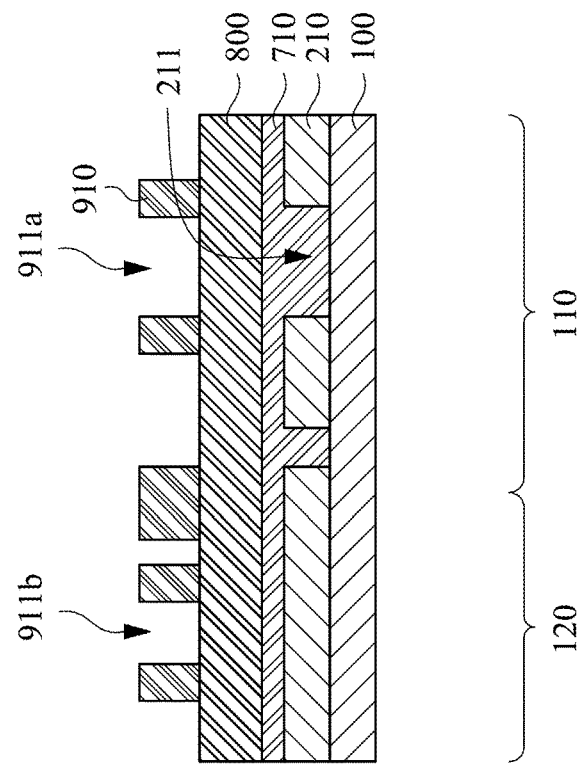
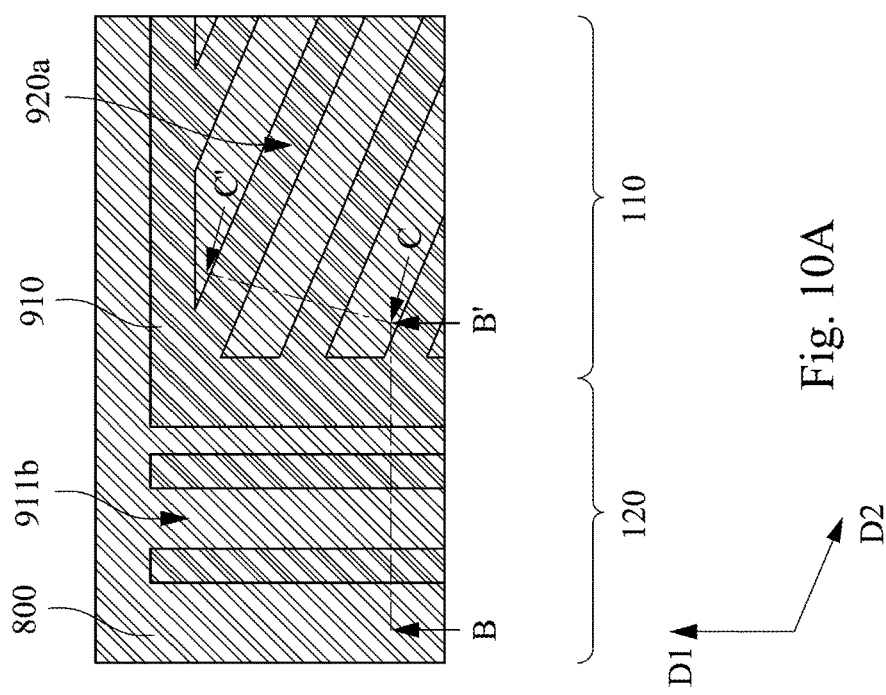
Fig. 10A
Fig. 10B

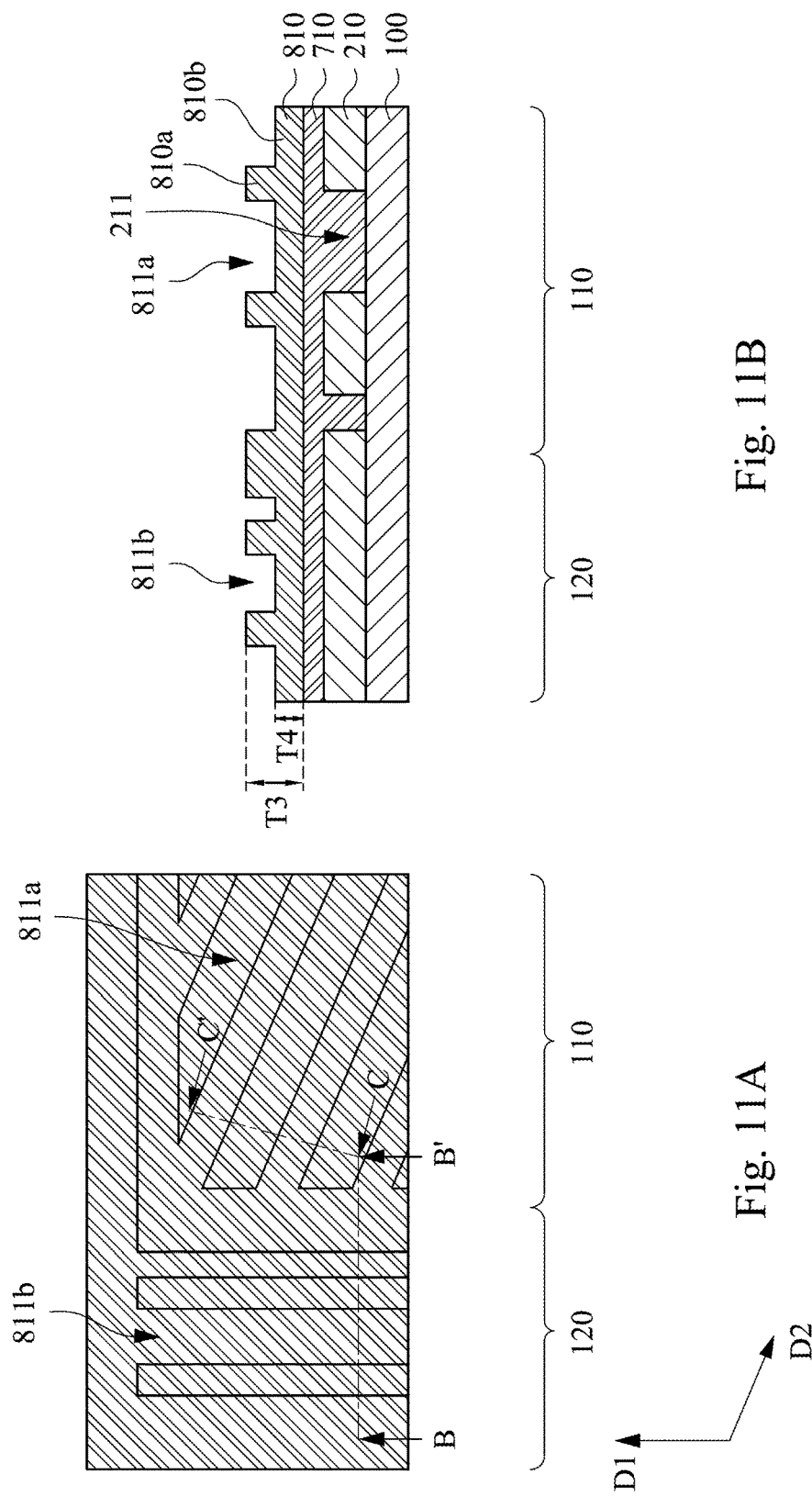

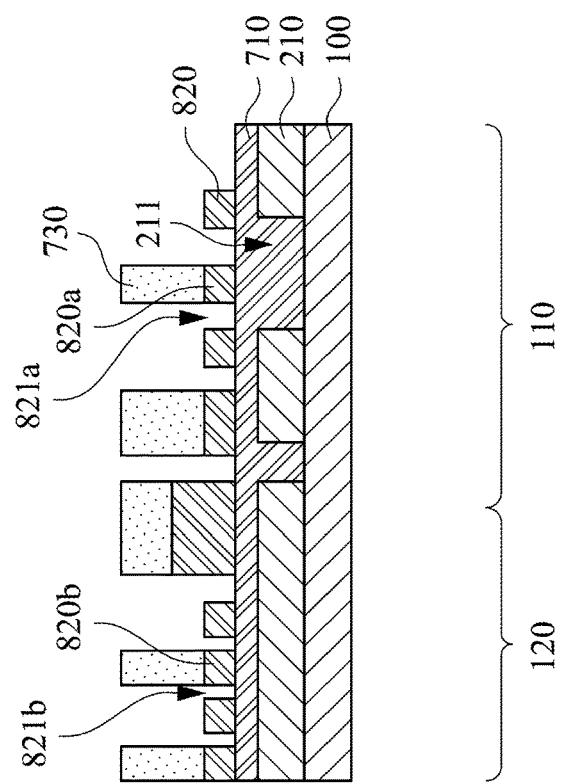
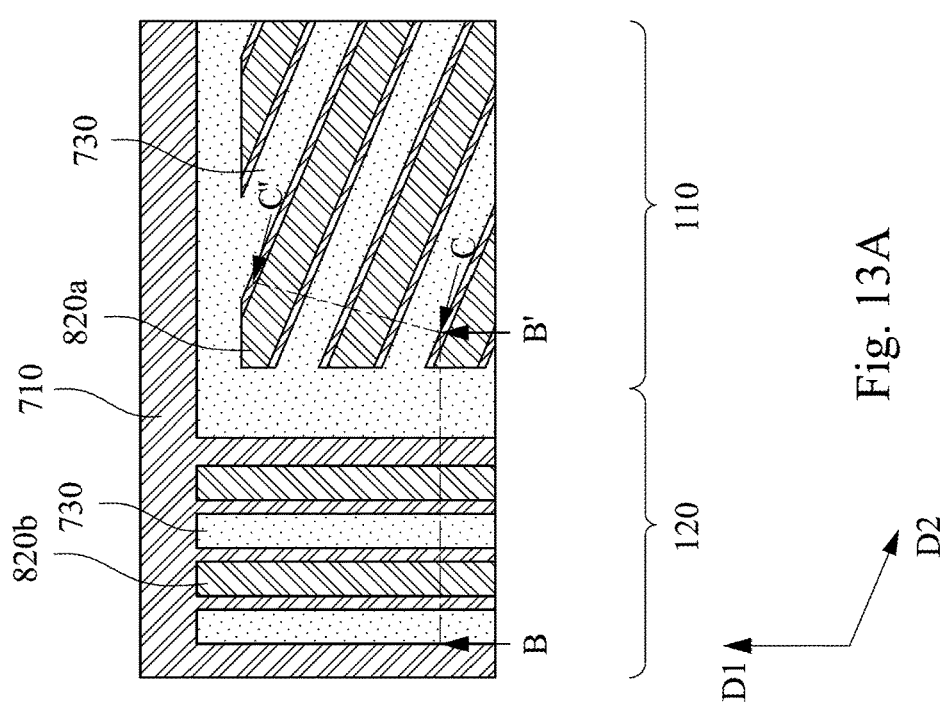
Fig. 13A
Fig. 13B

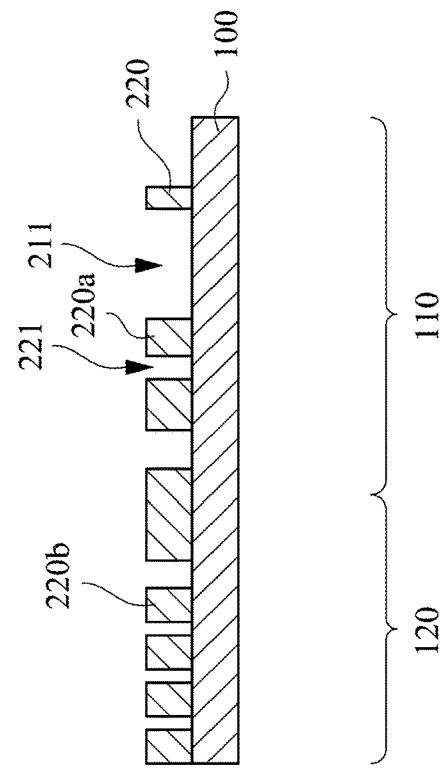
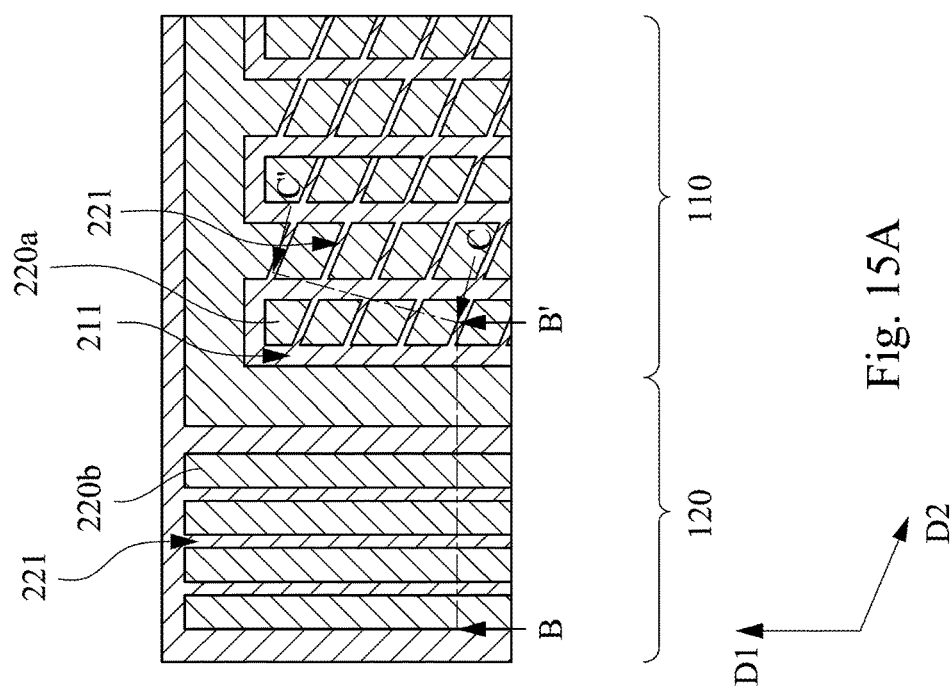
Fig. 15A
Fig. 15B

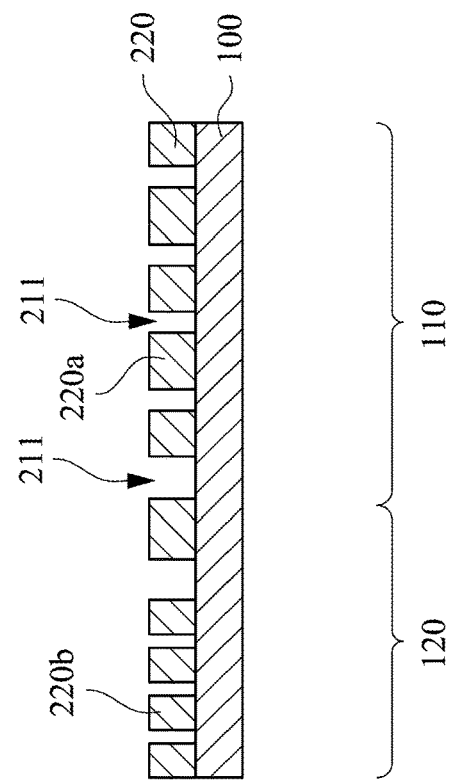
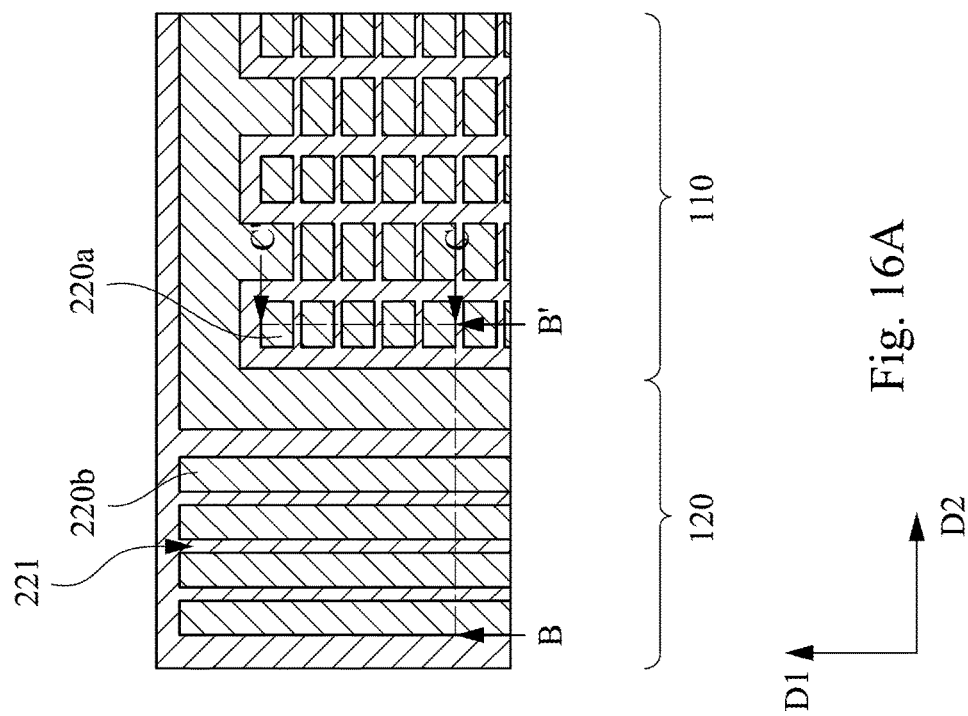
Fig. 16A
Fig. 16B

METHOD FOR MANUFACTURING A SEMICONDUCTOR DEVICE

BACKGROUND

Field of Invention

The present invention relates to a method for manufacturing a semiconductor device. More particularly, the present invention relates to a method of forming fine patterns for manufacturing a semiconductor device.

Description of Related Art

The semiconductor integrated circuit (IC) industry has experienced rapid growth. Technological progress in IC manufacture has produced several generations of ICs, and each generation fabricates smaller and more complex circuits than the previous generation. The critical dimension of patterns can be reduced by increasing the resolution of lithographic processes, but this approach usually costs much. To improve this issue, the so-called double patterning techniques have been proposed. However, conventional techniques have not been entirely satisfactory in all respects, and there is still a need to develop a new approach which is more cost-effective ways.

SUMMARY

An aspect of the present invention provides a method for manufacturing a semiconductor device. The method comprises the following operations: forming a first patterned target layer on a substrate having a first region and a second region, wherein the first patterned target layer has a plurality of first openings along a first direction in the first region, the first openings expose a portion of the substrate; forming a patterned hard mask layer over the first patterned target layer, wherein the patterned hard mask layer has a plurality of first recesses along a second direction in the first region and a plurality of second recesses along the first direction in the second region; forming a patterned photoresist layer over the patterned hard mask layer, wherein the patterned photoresist layer has a plurality of stripe structures along the second direction in the first region and a plurality of block structures along the first direction in the second region; and etching the patterned photoresist layer, the patterned hard mask layer, and the first patterned target layer by using the patterned hard mask layer and the patterned photoresist layer as etching masks to form a second patterned target layer.

In some embodiments of the present invention, a width of each stripe structure is smaller than a width of each first recess, a width of each block structure is smaller than a width of each second recess, each of the stripe structures overlaps a part of a corresponding one of the first recesses, and each of the block structures overlaps a part of a corresponding one of the second recesses.

In some embodiments of the present invention, a plurality of geometries of a top-viewing profile of the second patterned target layer in the first region are rhomboidal.

In some embodiments of the present invention, a plurality of geometries of a top-viewing profile of the second patterned target layer in the first region are rectangular.

In some embodiments of the present invention, the operation of forming the first patterned target layer on the substrate further comprises following operations: forming a target layer, a lower hard mask layer, and a first upper hard mask layer in sequence on the substrate; patterning the first upper hard mask layer to form a patterned first upper hard mask layer on the lower hard mask layer, wherein the patterned first upper hard mask layer has a plurality of second openings exposing portions of the lower hard mask layer; conformally forming a spacer layer on top surfaces and sidewalls of the patterned first upper hard mask layer and top surfaces of the exposed portions of the lower hard mask layer; etching the spacer layer to form a patterned spacer layer, wherein the patterned spacer layer includes a plurality of spacers located on the sidewalls of the patterned first upper hard mask layer, sidewalls of the adjacent spacers are spaced from each other by a third opening in the first region; filling the third opening with a material the same as the patterned first upper hard mask layer to form a second upper hard mask layer, wherein top surfaces of the spacers of the patterned spacer layer are exposed out of the second upper hard mask layer; etching the spacers of the patterned spacer layer and the lower hard mask layer by using the second upper hard mask layer as an etching mask to form a patterned lower hard mask layer; and etching the second upper hard mask layer, the patterned lower hard mask layer, and the target layer to form the first patterned target layer.

In some embodiments of the present invention, the operations of etching the spacer layer, etching the spacers of the patterned spacer layer and the lower hard mask layer, and etching the second upper hard mask layer, the patterned lower hard mask layer, and the target layer are performed by anisotropic etching processes.

In some embodiments of the present invention, the lower hard mask layer has a plurality of layers made of different material.

In some embodiments of the present invention, the spacer layer and the first upper hard mask layer are made of different material.

In some embodiments of the present invention, the spacer layer and the first upper hard mask layer comprise Si, SiN, SiCN or $SiO_2$.

In some embodiments of the present invention, the operation of etching the patterned photoresist layer, the patterned hard mask layer, and the first patterned target layer is performed by anisotropic etching processes.

In some embodiments of the present invention, the patterned hard mask layer has a plurality of layers made of different materials.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 1A-16A are top views illustrating various stages of a patterning method for forming a semiconductor device according to some embodiments of the present invention;

FIGS. 1B-16B are cross-sectional views corresponding respectively to FIGS. 1A-16A.

DETAILED DESCRIPTION

Figure 2A:
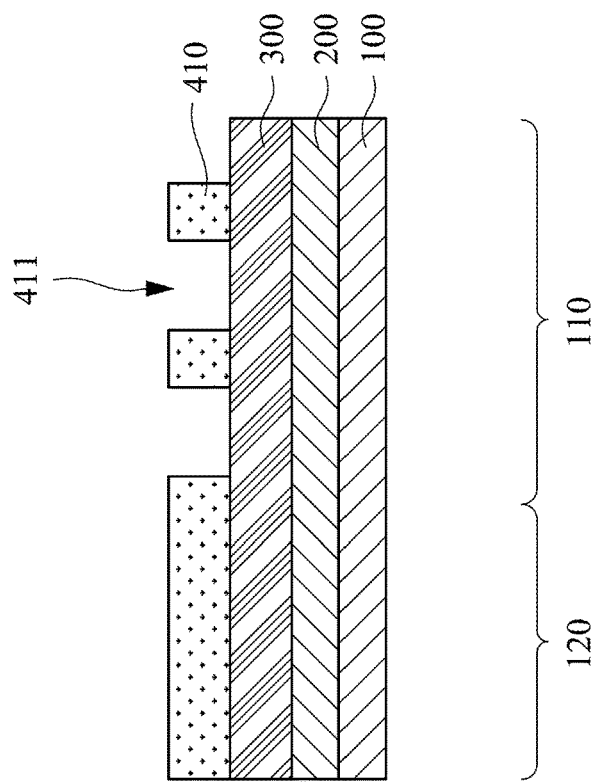

Reference will now be made in detail to the present embodiments of the invention, examples of which are illustrated in the accompanying drawings. Wherever possible, the same reference numbers are used in the drawings and the description to refer to the same or like parts.

Before describing the preferred embodiment in more detail, further explanation shall be given regarding certain terms that may be used throughout the descriptions.

The terms "forming," "form," "deposit," or "dispose" are used herein to describe the act of applying a layer of material to another layer. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a layer. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD).

FIGS. 1A-8A are top views illustrating various stages of a patterning method for forming a semiconductor device according to some embodiments of the present invention, and FIGS. 1B-8B are cross-sectional views corresponding respectively to FIGS. 1A-8A, taken along the line A-A'. Please refer to the top views and their respective cross-sectional views to have a better understanding for the exemplary process flow provided in the present invention.

Referring to FIG. 1A and FIG. 1B, a target layer 200, a lower hard mask layer 300, an upper hard mask layer 400, and a patterned photoresist layer 600 are formed in sequence on a substrate 100. The substrate 100 has a first region 110 and a second region 120. In an embodiment of the present invention, the first region 110 may be an array region, and the second region 120 may be a peripheral region. The thicknesses of the target layer 200, the lower hard mask layer 300, and the upper hard mask layer 400 may be appropriately varied by those skilled in the art. The patterned photoresist layer 600 has a plurality of openings 601 exposing portions of the upper hard mask layer 400 in the first region 110. In an embodiment of the present invention, the substrate 100 may be a silicon substrate. Alternatively, the substrate 100 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In an embodiment of the present invention, the substrate 100 may be a silicon layer of a silicon-on insulator (SOI) substrate. Insulating material, such as silicon oxide ($SiO_2$) may also be used as the substrate 100. In an embodiment of the present invention, the target layer 200 may be a metal layer or a dielectric material layer. In an embodiment of the present invention, the lower hard mask layer 300 or the upper hard mask layer 400 may be an amorphous carbon layer, a silicon layer, a silicon nitride (SiN) layer, a silicon carbon nitride (SiCN) layer or a silicon oxide ($SiO_2$) layer, but not limited thereto. It should be understood that the lower hard mask layer 300 and the upper hard mask layer 400 are made of different material. In an embodiment of the present invention, the lower hard mask layer 300 has a plurality of layers made of different material.

Figure 2B:
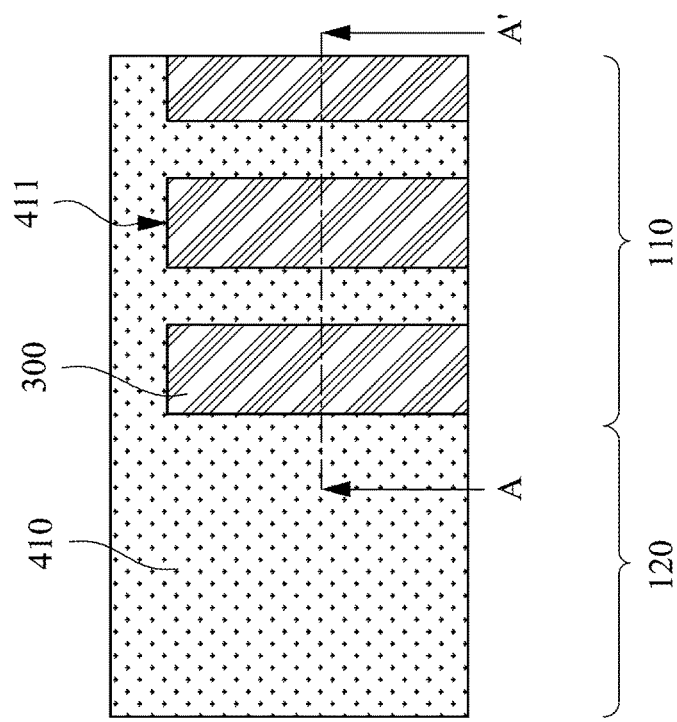

Referring to FIG. 2A and FIG. 2B, the upper hard mask layer 400 is etched to form a patterned upper hard mask layer 410 on the lower hard mask layer 300 by using the patterned photoresist layer 600 as an etching mask. Then, the patterned photoresist layer 600 is removed. The patterned upper hard mask layer 410 has a plurality of openings 411 corresponding to the openings 601 of the patterned photoresist layer 600. The openings 411 expose portions of the lower hard mask layer 300. In an embodiment of the present invention, etching the first upper hard mask layer 400 is performed by an anisotropic etching process such as the dry etching processes known in the art.

Figure 3B:
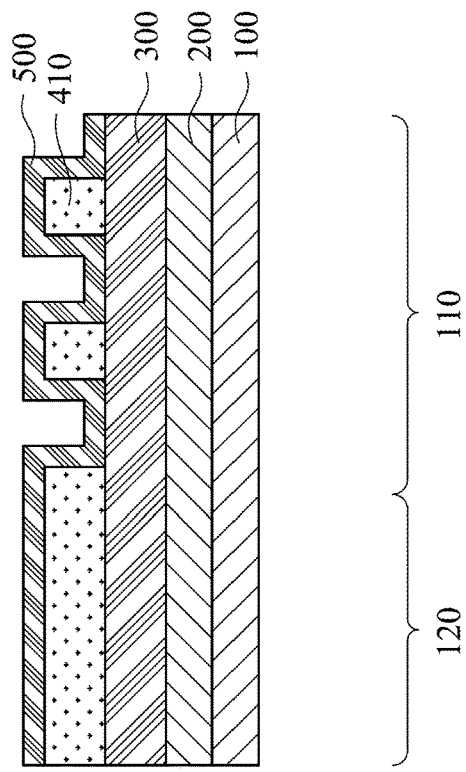
Figure 3A:
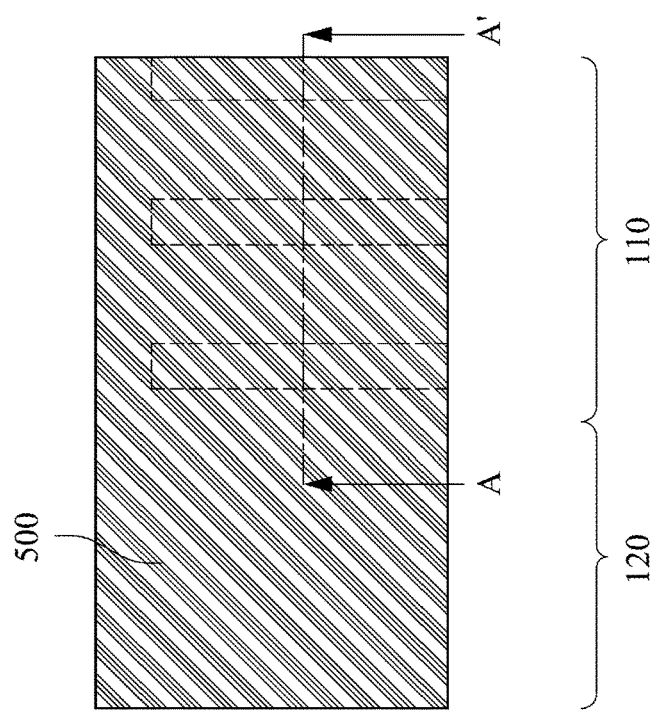

Referring to FIG. 3A and FIG. 3B, a spacer layer 500 is conformally formed on top surfaces and sidewalls of the patterned upper hard mask layer 410 and top surfaces of the exposed portions of the lower hard mask layer 300. In an embodiment of the present invention, the spacer layer 500 may include silicon, silicon nitride (SiN), silicon carbon nitride (SiCN) or silicon oxide ($SiO_2$). It should be understood that the spacer layer 500 and the patterned upper hard mask layer 410 are made of different material.

Figure 4B:
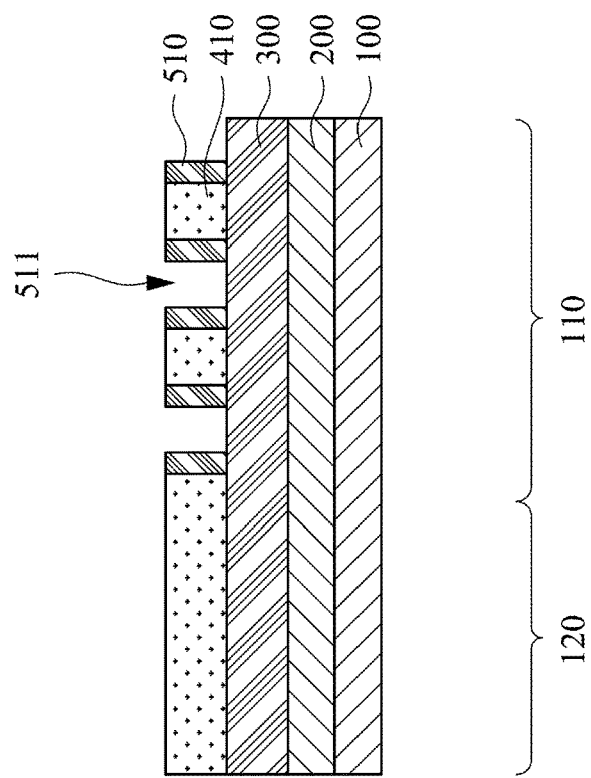
Figure 4A:
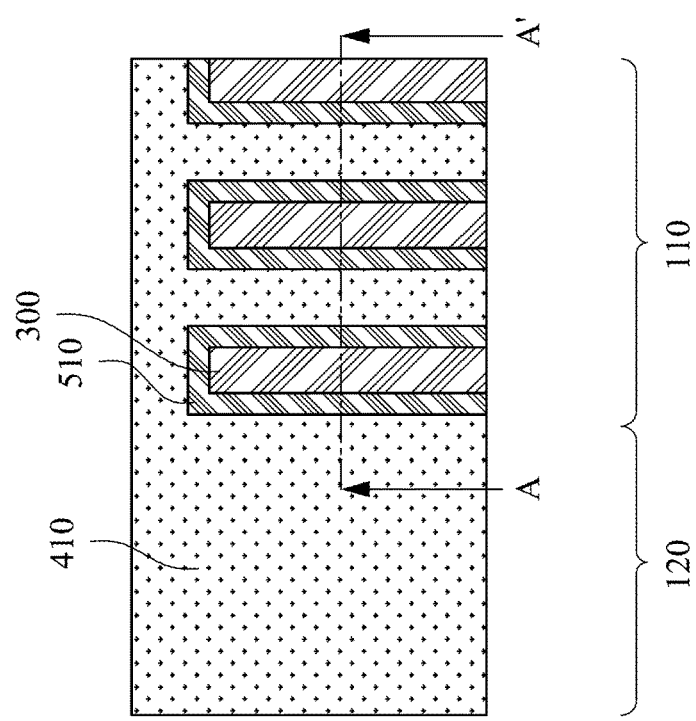

Referring to FIG. 4A and FIG. 4B, the spacer layer 500 is etched back to form a patterned spacer layer 510. The patterned spacer layer 510 includes a plurality of spacers located on the sidewalls of the patterned upper hard mask layer 410. The sidewalls of the adjacent spacers are spaced from each other by an opening 511 in the first region 110. A portion of top surfaces of the lower hard mask layer 300 is exposed through a corresponding one of the openings 511. In an embodiment of the present invention, etching the spacer layer 500 is performed by anisotropic etching processes such as the dry etching process known in the art.

Referring to FIG. 5A and FIG. 5B, a material 420 the same as the patterned upper hard mask layer 410 is deposited to cover the patterned upper hard mask layer 410, the spacers of the patterned spacer layer 510, and to fill the opening 511.

Subsequently, as shown in FIG. 6A and FIG. 6B, an upper portion of the material 420 is removed to form an upper hard mask layer 430. The top surfaces of the spacers of the patterned spacer layer 510 are exposed out of the upper hard mask layer 430. In an embodiment of the present invention, removing the upper portion of the material 420 may be achieved by a chemical mechanical polish (CMP) process, an etch back process or the like.

Figures 7A, 7B:
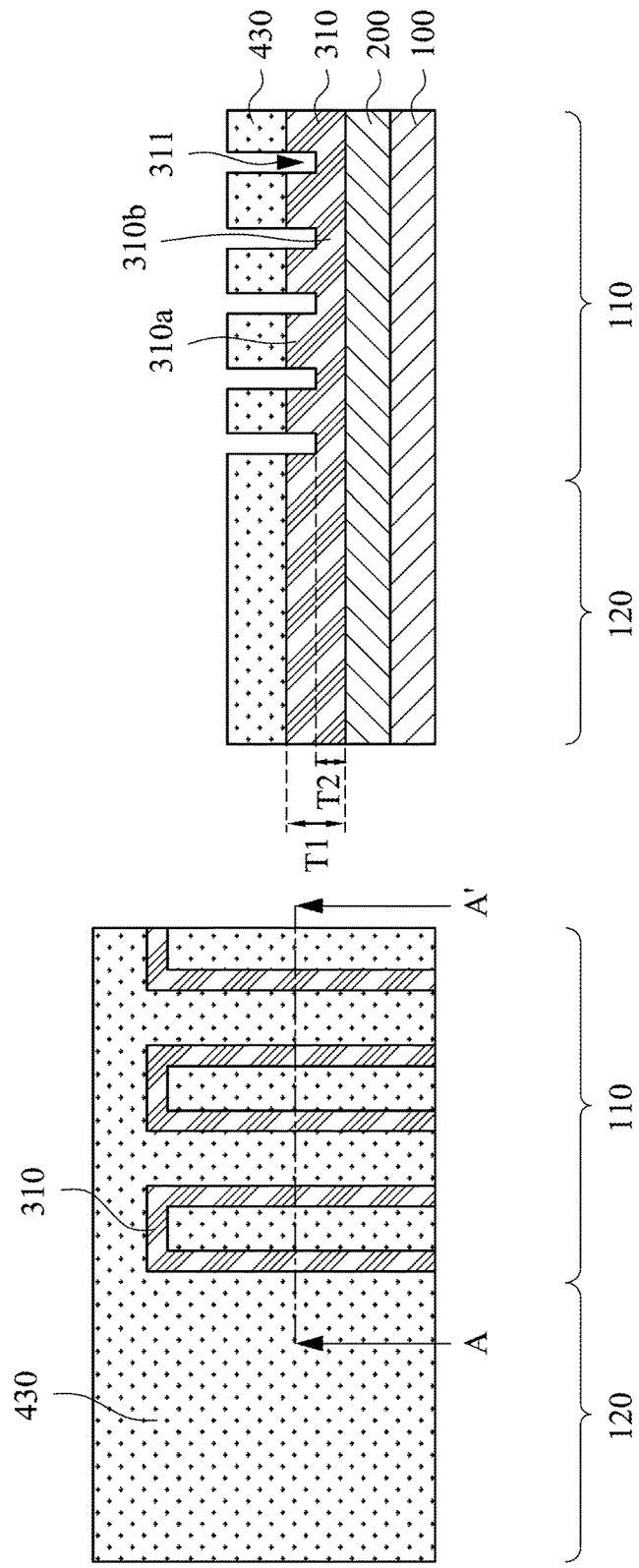

Referring to FIG. 7A and FIG. 7B, the spacers of the patterned spacer layer 510 and the lower hard mask layer 300 are etched by using the upper hard mask layer 430 as an etching mask to form a patterned lower hard mask layer 310. In an embodiment of the present invention, etching the spacers of the patterned spacer layer 510 and the lower hard mask layer 300 is performed by anisotropic etching processes such as the dry etching process known in the art. In an embodiment of the present invention, after the etching process is performed, the formed patterned lower hard mask layer 310 has a plurality of recesses 311 in the first region 110. In other words, the patterned lower hard mask layer 310 has a plurality of raised portions 310a and a plurality of recessed portions 310b. The raised portions 310a have a first thickness T1. The recessed portions 310b have a second thickness T2 less than the first thickness T1. The first thickness T1 and the second thickness T2 may be appropriately varied by those skilled in the art. As shown, the raised portions 310a are covered by the upper hard mask layer 430, while the recessed portions 310b are exposed through corresponding openings of the upper hard mask layer 430. In another embodiment of the present invention, after the etching process is performed, the formed patterned lower hard mask layer 310 has a plurality of openings exposing portions of the target layer 200 in the first region 110 (not shown).

Figure 8B:
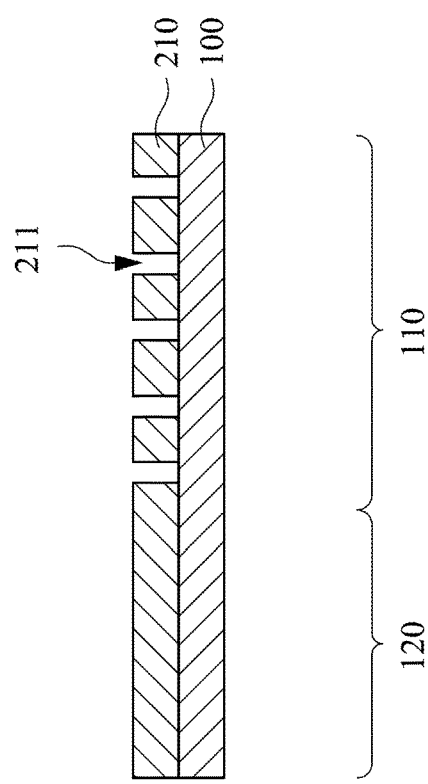
Figure 8A:
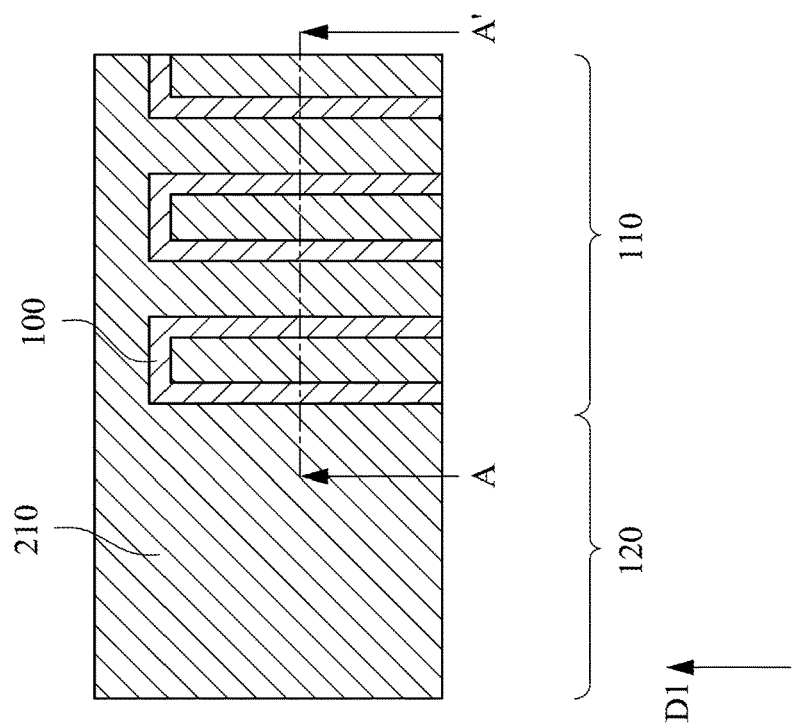

Referring to FIG. 8A and FIG. 8B, the upper hard mask layer 430, the patterned lower hard mask layer 310, and the target layer 200 are etched to form a first patterned target layer 210. In some embodiments, the etching process may be performed in a comprehensive manner so that the upper hard mask layer 430 and the patterned lower hard mask layer 310 are completely etched away, but the target layer 200 is partially etched. Particularly, the etching process stops when the recessed portions 310b and the underlying portions of the target layer 200 are etched away to form a plurality of openings 211 passing through the target layer 200. The remained portions of the target layer 200 constitute the first patterned target layer 210 having the openings 211. In specifics, the remained portions of the target layer 200 (i.e., first patterned target layer 210) are corresponding to the raised portions 310a, which substantially have a contour the same as the upper hard mask layer 430. The openings 211 are along a first direction D1 and are located in the first region 110 according to some examples. The openings 211 expose portions of the substrate 100. In an embodiment of the present invention, etching the upper hard mask layer 430, the patterned lower hard mask layer 310, and the target layer 200 is performed by anisotropic etching processes such as the dry etching processes known in the art.

Figure 9B:
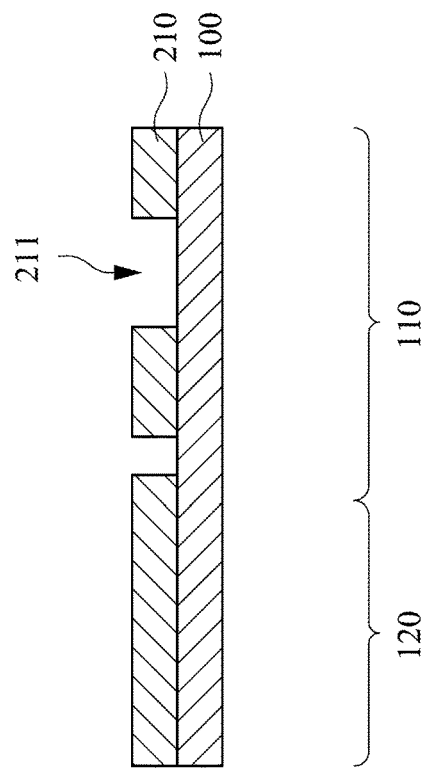
Figure 9A:
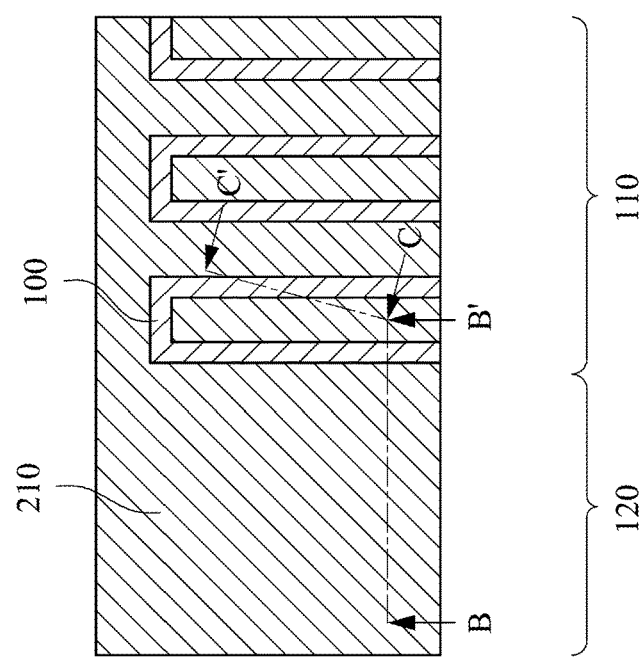

For a better understanding of the following steps of the present invention, FIG. 9A and FIG. 9B shows the same structure as that in FIG. 8A and FIG. 8B in a different manner, in which FIG. 9B shows cross-sectional view along the line B-B' and the line C-C' in FIG. 9A. Further, FIGS. 10A-15A are top views illustrating the following processes of the patterning process according to some embodiments of the present invention, and FIGS. 10B-15B are cross-sectional views corresponding respectively to FIGS. 10A-15A, taken along the line B-B' and line C-C'.

Referring to FIG. 10A and FIG. 10B, an organic layer 710, a hard mask layer 800, and a patterned photoresist layer 910 are formed in sequence on the first patterned target layer 210. The organic layer 710 fills the openings 211. The thicknesses of the organic layer 710, the hard mask layer 800, and the patterned photoresist layer 910 may be appropriately varied by those skilled in the art. In an embodiment of the present invention, the organic layer 710 may include polyester (PET), polyolefin, resin, or other suitable organic material. In an embodiment of the present invention, the organic layer 710 may be formed by a spin-on coating process, and the top surface of the organic layer 710 is substantially flat. In an embodiment of the present invention, the hard mask layer 800 may be an amorphous carbon layer, a silicon layer, a silicon nitride (SiN) layer, a silicon carbon nitride (SiCN) layer or a silicon oxide ($SiO_2$) layer, but not limited thereto. In an embodiment of the present invention, the hard mask layer 800 has a plurality of layers made of different material. The patterned photoresist layer 910 has a plurality of stripe structures 910a along the second direction D2 in the first region 110 and a plurality of block structures 910b along the first direction D1 in the second region 120. As shown, two adjacent stripe structures 910a are spaced apart by a first opening 911a in the first region 110. Similarly, two adjacent block structures 910b are spaced apart by a second opening 911b in the second region 120. It should be understood that although each block structure 910b depicted in FIG. 10A is a long strip block structure, in some embodiments, each of the block structures 910b may be replaced with a plurality of sub-block structures arranged in the first direction D1. In such embodiments, two adjacent sub-block structures are spaced apart by an opening exposing a portion of the hard mask layer 800 in the second region 120. The first openings 911a expose portions of the hard mask layer 800 in the first region 110. The second openings 911b expose portions of the hard mask layer 800 in the second region 120.

Referring to FIG. 11A and FIG. 11B, the hard mask layer 800 is etched by using the patterned photoresist layer 910 as an etching mask to form a patterned hard mask layer 810. Then, the patterned photoresist layer 910 is removed. The patterned hard mask layer 810 has a plurality of first recesses 811a along the second direction D2 in the first region 110 and a plurality of second recesses 811b along the first direction D1 in the second region 120. The first recesses 811a have a pattern corresponding to or substantially the same as that of the first openings 911a of the patterned photoresist layer 910. The second recesses 811b have a pattern corresponding to or substantially the same as that of the second openings 911b of the patterned photoresist layer 910. In other words, the patterned hard mask layer 810 has a plurality of raised portions 810a and a plurality of recessed portions 810b. The raised portions 810a have a first thickness T3. The recessed portions 810b have a second thickness T4 less than the first thickness T3. The first thickness T3 and the second thickness T4 may be appropriately varied by those skilled in the art. In an embodiment of the present invention, etching the hard mask layer 800 is performed by anisotropic etching processes such as the dry etching process known in the art.

Figures 12A, 12B:
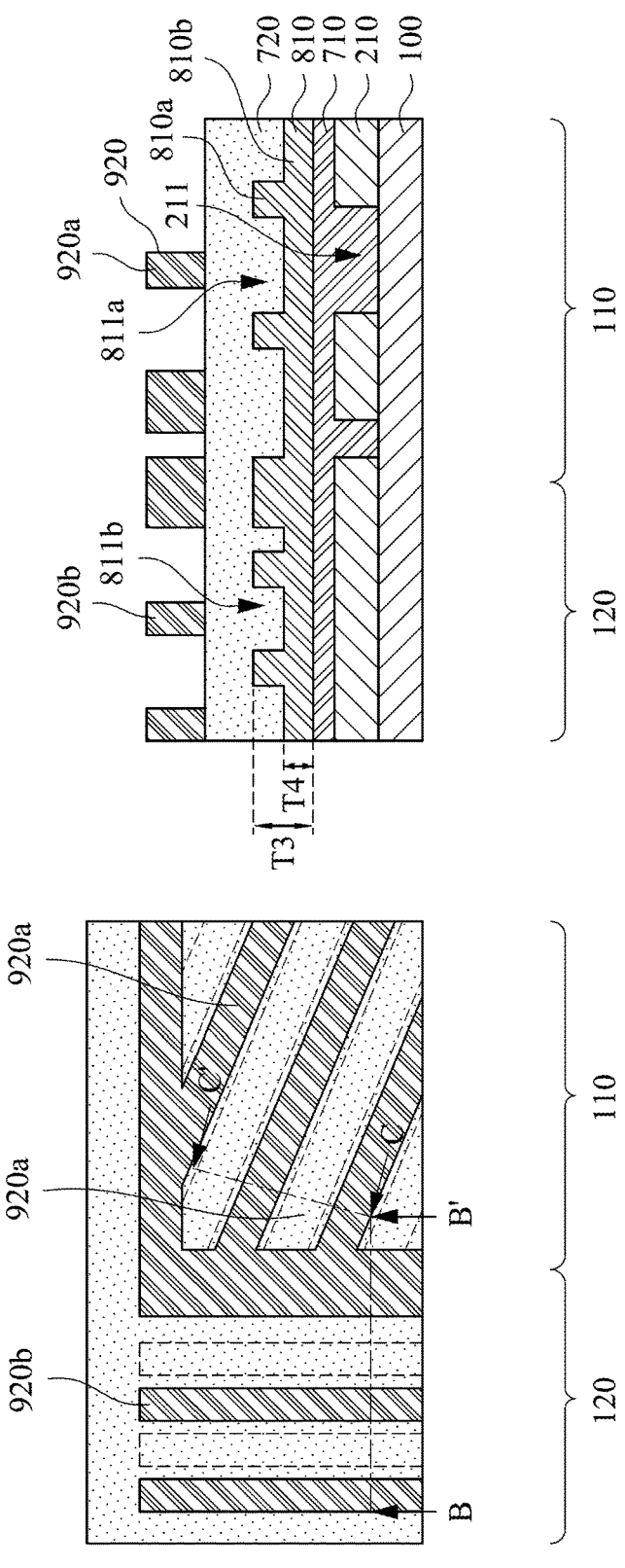

Referring to FIG. 12A and FIG. 12B, an organic layer 720 and a patterned photoresist layer 920 are formed in sequence on the patterned hard mask layer 810. The organic layer 720 fills the first recesses 811a and the second recesses 811b. The thicknesses of the organic layer 720 and the patterned photoresist layer 920 may be appropriately varied by those skilled in the art. In an embodiment of the present invention, the organic layer 720 may include polyester (PET), polyolefin, resin, or other suitable organic material. In an embodiment of the present invention, the organic layer 720 may be formed by spin-on coating, and the top surface of the organic layer 720 is substantially flat. The patterned photoresist layer 920 has a plurality of stripe structures 920a along the second direction D2 in the first region 110 and a plurality of block structures 920b along the first direction D1 in the second region 120. The width of the stripe structures 920a is smaller than the width of the first recesses 811a. The width of the block structures 920b is smaller than the width of the second recesses 811b. Each of the stripe structures 920a overlaps a part of a corresponding recess 811a, but the long sides of each recess 811a are not overlapped with the corresponding stripe structure 920. In other words, the edge portions of the recessed portions 810b are not overlapped with the patterned photoresist layer 920. Each of the block structures 920b overlaps a part of a corresponding recess 811b but does not overlap the long sides of the corresponding recess 811b. It should be understood that although each block structure 920b depicted in FIG. 12A is a long strip block structure, in some embodiments, each of the block structures 920b may be replaced with a plurality of sub-block structures arranged in the first direction D1. In such embodiments, two adjacent sub-block structures are spaced apart by an opening exposing a portion of the organic layer 720 in the second region 120.

Referring to FIG. 13A and FIG. 13B, the patterned photoresist layer 920 and the organic layer 720 are etched to form a patterned organic layer 730. The portions of the organic layer 720 that are not overlapped with the patterned photoresist layer 920 are removed while the portions overlapped with the patterned photoresist layer 920 are retained so to form the patterned organic layer 730. It is noted that the patterned organic layer 730 is formed on the recessed portions 810b (shown in FIG. 12B), but the edge portions of the recessed portions 810b are exposed. Then, the patterned hard mask layer 810 is etched by using the patterned organic layer 730 as an etching mask to form a patterned hard mask layer 820 (shown in FIG. 13B). As described above, the patterned hard mask layer 810 has the raised portions 810a and the recessed portions 810b, in which the first thickness T3 of the raised portions 810a is greater than the second thickness T4 of the recessed portions 810b. While the exposed edge portions of the recessed portions 810b are etched through, a plurality of first opening 821a are formed in the first region 110 and a plurality of second opening 821b are formed in the second region 120. Concurrently, certain lower portions of the raised portions 810a are still retained so to constitute the patterned hard mask layer 820. In examples, the patterned hard mask layer 820 has a plurality of stripe structures 820a spaced apart from each other and a plurality of stripe structures 820b spaced apart from each other. Specifically, two adjacent stripe structures 820a are spaced apart by at least one the first opening 821a in the first region 110. Similarly, two adjacent stripe structures 820b are spaced apart by at least one the second opening 821b in the second region 120. In an embodiment of the present invention, etching the patterned photoresist layer 920 and the organic layer 720 and etching the patterned hard mask layer 810 are performed by anisotropic etching processes such as the dry etching process known in the art.

Figures 14A, 14B:
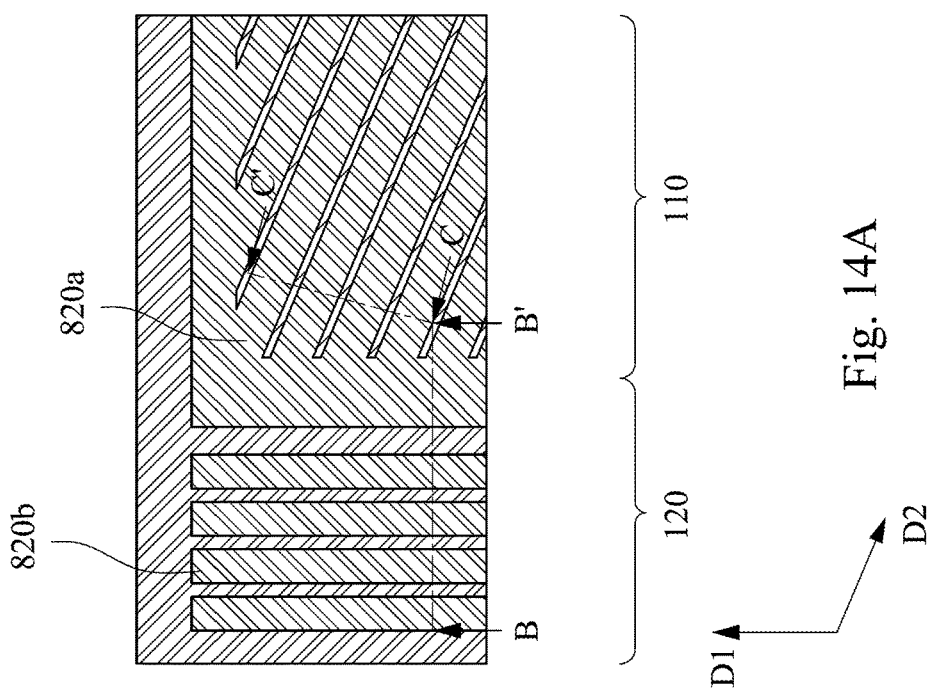

Referring to FIG. 14A and FIG. 14B, the patterned organic layer 730, the organic layer 710, and the first patterned target layer 210 are etched by using the patterned hard mask layer 820 as an etching mask to form a patterned organic layer 710' and a second patterned target layer 220. The patterned organic layer 710' has a plurality of first opening 710a and a plurality of second openings 710b, and the second patterned target layer 220 has a plurality of third openings 221. It is noted that the third openings 221 communicate with the first openings 710a and the second openings 710b, and corresponds to the first and second openings 821a, 821b of the patterned hard mask layer 820. In an embodiment of the present invention, etching the patterned organic layer 730, the organic layer 710, and the first patterned target layer 210 is performed by anisotropic etching processes such as the dry etching process known in the art. Therefore, the second patterned target layer 220 are covered by the patterned organic layer 710' and the patterned hard mask layer 820.

Referring to FIG. 15A and FIG. 15B, the patterned hard mask layer 820 and the patterned organic layer 710' are removed to expose the second patterned target layer 220. As shown, the second patterned target layer 220 has the openings 211 and the third openings 221. The openings 211 are along the first direction D1, and the third openings 221 in the first region 110 are along the second direction D2. In some examples, the width of the third openings 221 is less than the width of the openings 211. It will be appreciated that an angle between the first direction D1 and the second direction D2 is larger than zero degrees such that the second patterned target layer 220 in the first region 110 comprises a plurality of first geometries 220a as viewed from the top. In an embodiment of the present invention, the first geometries 220a of the top-viewing profile of the second patterned target layer 220 in the first region 110 are rhomboidal. In addition, the third openings 221 in the second region 120 are along the first direction D1. Therefore, the second patterned target layer 220 in the second region 120 comprises a plurality of second geometries 220b as viewed from the top.

In an embodiment of the present invention, the second geometries 220b of the top-viewing profile of the second patterned target layer 220 in the second region 120 are elongated rectangle. In an embodiment of the present invention, removing the patterned hard mask layer 820 and the patterned organic layer 710' is performed by any suitable etching processes such as the dry etching process or the wet etching process known in the art.

FIG. 16A is a top view illustrating a patterned layer according to other embodiments of the present invention. FIG. 16B is a cross-sectional view taken along the line B-B' and line C-C' in FIG. 16A. FIG. 16A and FIG. 16B show a similar structure to that in FIG. 15A and FIG. 15B, except that the angle between the first direction D1 and the second direction D2 of the structure in FIG. 16A and FIG. 16B is 90°. As described above, the second patterned target layer 220 in the first region 110 comprises a plurality of first geometries 220a as viewed from the top. In the embodiment of FIG. 16A and FIG. 16B, the first geometries 220a of the top-viewing profile of the second patterned target layer 220 in the first region 110 are rectangles.

The patterning method of the present invention allows the desired pattern to be simultaneously formed in the first region and in the second region of the target layer, thereby avoiding the complicated process of forming the desired pattern in the first region and in the second region in different processes. In addition, the double patterning technique is incorporated into the patterning method of the present invention, so that the fine pattern can be formed by this cost-effective way.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a semiconductor device, comprising following operations:

forming a first patterned target layer on a substrate having a first region and a second region, wherein the first patterned target layer has a plurality of first openings along a first direction in the first region, the first openings expose a portion of the substrate;

forming a patterned hard mask layer over the first patterned target layer, wherein the patterned hard mask layer has a plurality of first recesses along a second direction in the first region and a plurality of second recesses along the first direction thereon in the second region;

forming a patterned photoresist layer over the patterned hard mask layer, wherein the patterned photoresist layer has a plurality of stripe structures along the second direction in the first region and a plurality of block structures along the first direction in the second region; and etching the patterned photoresist layer, the patterned hard mask layer, and the first patterned target layer by using the patterned hard mask layer and the patterned photoresist layer as etching masks to form a second patterned target layer.

2. The method of claim 1, wherein a width of each stripe structure is smaller than a width of each first recess, a width of each block structure is smaller than a width of each second recess, each of the stripe structures overlaps a part of a corresponding one of the first recesses, and each of the block structures overlaps a part of a corresponding one of the second recesses.

3. The method of claim 1, wherein a plurality of geometries of a top-viewing profile of the second patterned target layer in the first region are rhomboidal.

4. The method of claim 1, wherein a plurality of geometries of a top-viewing profile of the second patterned target layer in the first region are rectangular.

5. The method of claim 1, wherein the operation of forming the first patterned target layer on the substrate further comprises following operations:
  forming a target layer, a lower hard mask layer, and a first upper hard mask layer in sequence on the substrate;
  patterning the first upper hard mask layer to form a patterned first upper hard mask layer on the lower hard mask layer, wherein the patterned first upper hard mask layer has a plurality of second openings exposing portions of the lower hard mask layer;
  conformally forming a spacer layer on top surfaces and sidewalls of the patterned first upper hard mask layer and top surfaces of the exposed portions of the lower hard mask layer;
  etching the spacer layer to form a patterned spacer layer, wherein the patterned spacer layer includes a plurality of spacers located on the sidewalls of the patterned first upper hard mask layer, sidewalls of the adjacent spacers are spaced from each other by a third opening in the first region;
  filling the third opening with a material the same as the patterned first upper hard mask layer to form a second upper hard mask layer, wherein top surfaces of the spacers of the patterned spacer layer are exposed out of the second upper hard mask layer;
  etching the spacers of the patterned spacer layer and the lower hard mask layer by using the second upper hard mask layer as an etching mask to form a patterned lower hard mask layer; and
  etching the second upper hard mask layer, the patterned lower hard mask layer, and the target layer to form the first patterned target layer.

6. The method of claim 5, wherein the operations of etching the spacer layer, etching the spacers of the patterned spacer layer and the lower hard mask layer, and etching the second upper hard mask layer, the patterned lower hard mask layer, and the target layer are performed by anisotropic etching processes.

7. The method of claim 5, wherein the lower hard mask layer has a plurality of layers made of different material.

8. The method of claim 5, wherein the spacer layer and the first upper hard mask layer are made of different material.

9. The method of claim 8, wherein the spacer layer and the first upper hard mask layer comprise Si, SiN, SiCN or $SiO_2$.

10. The method of claim 1, wherein the operation of etching the patterned photoresist layer, the patterned hard mask layer, and the first patterned target layer is performed by anisotropic etching processes.

11. The method of claim 1, wherein the patterned hard mask layer has a plurality of layers made of different materials.

* * * * *